(12) United States Patent
Handtmann et al.

(10) Patent No.: US 7,515,018 B2
(45) Date of Patent: Apr. 7, 2009

(54) ACOUSTIC RESONATOR

(76) Inventors: Martin Handtmann, Nabburgerstrasse 19, 81737 Munich (DE); Jyrki Kaitila, Jyrki Kaitila c/o Infineon Technologies, IFAG COM PS RF M BAW, Am Campeon 1-12, 85579 Neubiberg, Munich (DE); Andreas Meckes, Höhenstadler Str. 29, 81671 Munich (DE); Lueder Elbrecht, Talwergweg 7b, 81825 Munich (DE)

( * ) Notice: Subject to any disclaimer, the term of this patent is extended or adjusted under 35 U.S.C. 154(b) by 168 days.

(21) Appl. No.: 11/513,895

(22) Filed: Aug. 31, 2006

(65) Prior Publication Data

US 2008/0055020 A1    Mar. 6, 2008

(51) Int. Cl.
    *H03H 9/00* (2006.01)
(52) U.S. Cl. .............................. 333/133; 333/134
(58) Field of Classification Search ............... 333/133, 333/187–189
    See application file for complete search history.

(56) References Cited

U.S. PATENT DOCUMENTS

| | | | |
|---|---|---|---|
| 5,587,620 | A | 12/1996 | Ruby et al. |
| 5,714,917 | A * | 2/1998 | Ella .......................... 332/144 |
| 5,873,153 | A | 2/1999 | Ruby et al. |
| 6,073,676 | A | 6/2000 | Hairy et al. |
| 6,107,721 | A | 8/2000 | Lakin |
| 6,507,983 | B1 | 1/2003 | Ruby et al. |
| 6,933,807 | B2 | 8/2005 | Marksteiner et al. |
| 6,975,183 | B2 | 12/2005 | Aigner et al. |
| 2002/0175781 | A1* | 11/2002 | Wunnicke et al. ........... 333/133 |
| 2004/0046622 | A1 | 3/2004 | Aigner et al. |
| 2005/0030126 | A1 | 2/2005 | Inoue et al. |
| 2006/0290446 | A1 | 12/2006 | Aigner |
| 2008/0048802 | A1 | 2/2008 | Aigner et al. |

FOREIGN PATENT DOCUMENTS

| | | |
|---|---|---|
| DE | 10150253 | 4/2003 |
| DE | 102005028927 A1 | 12/2006 |
| EP | 0809555 B1 | 4/1999 |
| EP | 1438787 B1 | 3/2005 |
| WO | WO 2008/009274 A1 | 1/2008 |

OTHER PUBLICATIONS

Ballato, A. and T. Lukasek. "A Novel Frequency Selective Device: The Stacked Crystal Filter." Proc. 27th Annual Freq. Control Symposium, Jun. 1973. p. 262-269. (8 Pages).

(Continued)

*Primary Examiner*—Don P Le

(57) ABSTRACT

An acoustic resonator is described, the acoustic resonator comprising a stack of a first and a second piezoelectric body, wherein said first and second piezoelectric bodies have substantially the same spatial piezoelectric orientation, an intermediate intermediate electrode being arranged between said first and said second piezoelectric body forming a first terminal of said acoustic resonator, and first and second electrodes, wherein said first electrode is arranged such that said first piezoelectric body is arranged between said first electrode and said intermediate electrode, wherein said second electrode is arranged such that said second piezoelectric body is arranged between said second electrode and said intermediate electrode, and wherein said first and said second electrode are electrically connected to each other forming a second terminal of said acoustic resonator.

21 Claims, 11 Drawing Sheets

OTHER PUBLICATIONS

Lakin, K. M. "Equivalent Circuit Modeling of Stacked Crystal Filters." Proc. 35$^{th}$ Annual Freq. Control Symposium, 1981. p. 257-262. (6 Pages).

Stokes, R. B. and J. D. Crawford. "X-Band Thin Film Acoustic Filters on GaAs." IEEE Trans. Microwave Theory Tech. vol. 41 No. 6/7. Dec. 1993. p. 1075-1080. (6 Pages).

Lakin, K. M. et al. "High Performance Stacked Crystal Filters for GPS and Wide Bandwidth Applications." IEEE 2001 Ultrasonics Symposium Proc. 2001. p. 833-838. (6 Pages).

Lakin, K. M. "Thin Film Resonator Technology." IEEE 2003 FCS-EFTF Paper Wel A4. 2003. p. 6. (14 Pages).

* cited by examiner

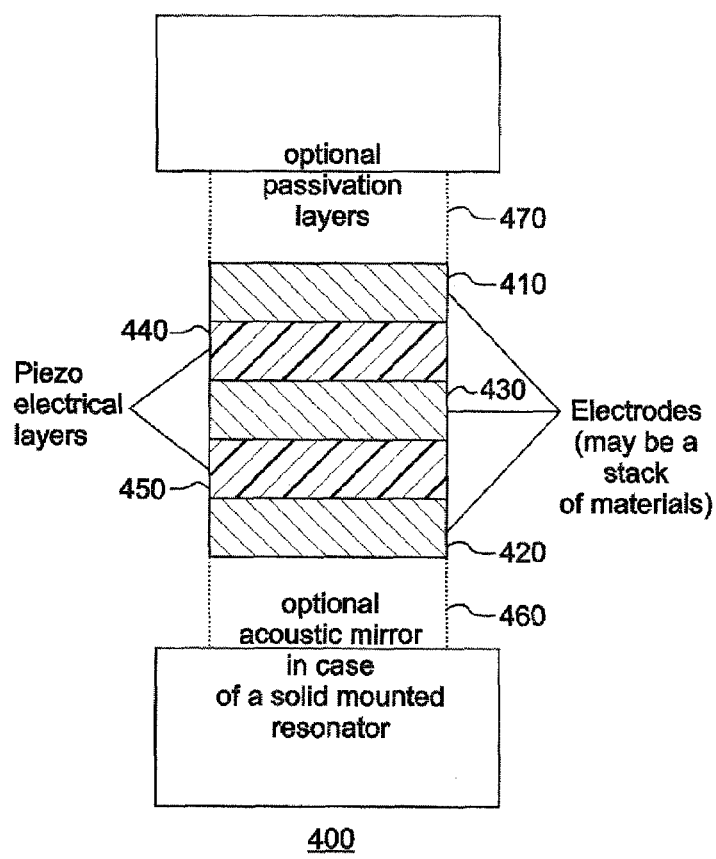
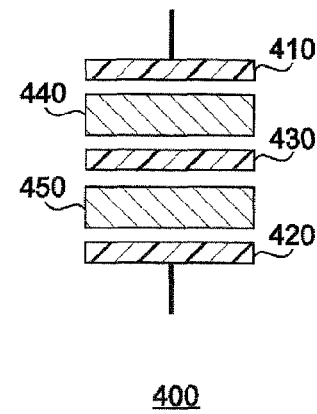
FIG. 4A
FIG. 4B

ACOUSTIC RESONATOR

BACKGROUND

The present invention relates to a piezoelectric device, such as used for example in filter structures.

Due to their high resonance frequencies and their high quality, in particular in mobile radio communication, bulk acoustic wave (BAW) resonators have been widely used. A simple implementation of a BAW resonator comprises a thin layer of piezoelectric material arranged between two metal electrodes.

In ladder-type filters based on BAW resonators a non-linear behavior has been observed, for example in antenna-duplexers which operate directly at the antenna of mobile phone systems and transmit power levels exceeding certain power values. This problem arises for example when 0.1 W.

SHORT DESCRIPTION OF THE DRAWINGS

FIG. 4A shows an exemplary schematic cross-section of a possible stacked crystal filter (SCF);

FIG. 4B shows a symbol of an possible stacked crystal filter;

FIG. 6C shows an exemplary input impedance of the stacked crystal resonator as shown in FIG. 6A;

DETAILED DESCRIPTION

Figure 1:
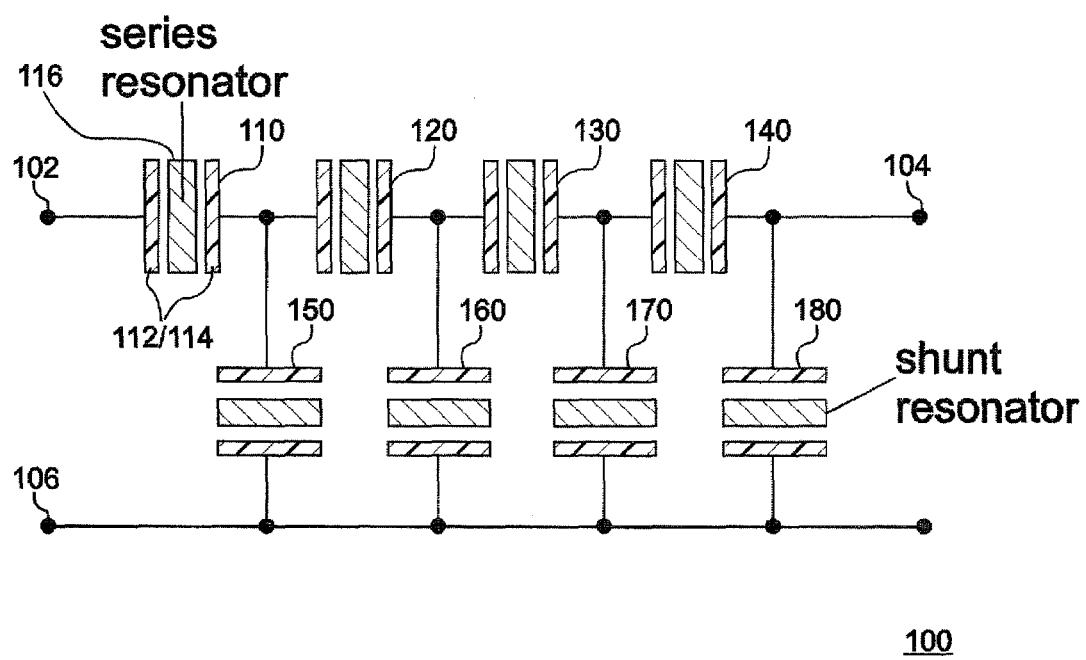
FIG. 1 shows a block diagram of a possible ladder-type BAW filter with four stages, each consisting of a series resonator and a shunt resonator.

According to an embodiment of the present invention, an inventive acoustic resonator comprises a stack of a first and a second piezoelectric body, with the first and second piezoelectric bodies having the same spatial piezoelectric orientation, an intermediate intermediate electrode being arranged between the first and second piezoelectric bodies forming a first terminal of the acoustic resonator, and first and second electrodes, wherein the first electrode is arranged such that the first piezoelectric body is arranged between the first electrode and the intermediate intermediate electrode, wherein the second electrode is arranged such that the second piezoelectric body is arranged between the second electrode and the intermediateintermediate electrode, and wherein the first and second electrode are electrically connected to each other forming a second terminal of the acoustic resonator.

According to another embodiment of the present invention, a filter with a ladder structure is provided, comprising: an acoustic resonator having a stack of a first and a second piezoelectric body, wherein the first and second piezoelectric bodies have a same spatial piezoelectric orientation, a intermediate electrode being arranged between the first and the second piezoelectric body forming a first terminal of the acoustic resonator, and first and second electrodes, wherein the first electrode is arranged such that the first piezoelectric body is arranged between the first electrode and the intermediate electrode, wherein the second electrode is arranged such that the second piezoelectric body is arranged between the second electrode and the intermediate electrode, and wherein the first and the sec-intermediate electrode, and wherein the first and the second electrode are electrically connected to each other forming a second terminal of the acoustic resonator, wherein the first acoustic resonator is arranged in a series path of the ladder structure or in a shunt path of the ladder structure.

According to a further embodiment of the present invention, a method for producing an acoustic resonator is provided, comprising the steps of: providing a structure, comprising a stack of a first and a second piezoelectric body, wherein the first and second piezoelectric bodies have a same spatial piezoelectric orientation, a intermediate electrode being arranged between the first and the second piezoelectric body forming a first terminal of the acoustic resonator, and first and second electrodes, wherein the first electrode is arranged such that the first piezoelectric body is arranged between the first electrode and the intermediate electrode, and wherein the second electrode is arranged such that the second piezoelectric body is arranged between the second electrode and the intermediate electrode; and connecting the first and the second electrode electrically to form a second terminal of the acoustic resonator.

According to a further embodiment of the present invention, a method for producing a filter with a ladder structure is provided, comprising the steps of: providing a structure, comprising a stack of a first and a second piezoelectric body, wherein the first and second piezoelectric bodies have a same spatial piezoelectric orientation, comprising a intermediate electrode being arranged between the first and the second piezoelectric body forming a first terminal of an acoustic resonator, and comprising first and second electrodes, wherein said first electrode is arranged such that the first piezoelectric body is arranged between the first electrode and the intermediate electrode, and wherein the second electrode is arranged such that the second piezoelectric body is arranged between the second electrode and the intermediate electrode; connecting the first and the second electrode electrically to form a second terminal of the acoustic resonator; and connecting the acoustic resonator so that the acoustic resonator is connected in a series or shunt path of the ladder structure.

Before describing further embodiments of the present invention in more detail, it should be noted that objects with the same or similar functional properties are denoted with the same reference signs. Unless explicitly noted otherwise, the description with respect to objects with similar or equal functional properties can be exchanged with respect to each other.

Ladder-type BAW filters, possible implementations of resonators having reduced non-linearity and a stacked crystal filter (SCF) are discussed in general to provide a better understanding of the embodiments and their advantages. It should be noted that although the following embodiments and effects are described based on stacked crystal filters (SCF) and stacked crystal filter resonators (SCF resonator or SCR), any other equivalent structure, e.g. equivalent to a stacked crystal filter with regard to its piezoelectric and/or electro-acoustic resonance characteristics, can be used to implement or produce an embodiment of an inventive acoustic resonator to achieve essentially the same advantages and effects.

FIG. 1 shows an exemplary ladder-type BAW filter based on possible BAW resonators with four stages, each stage consisting of a series resonator and a shunt resonator. FIG. 1 shows in detail a ladder-type filter 100 with an input terminal 102, an output terminal 104, and a common terminal 106, the input port 102 and the common port 106 forming the input port and the output terminal 104 and the common terminal 106 forming an output port. The ladder-type BAW filter 100 comprises four series resonators 110, 120, 130 and 140, and four shunt resonators 150, 160, 170 and 180. Each resonator 110, 120, 130, 140, 150, 160, 170, 180 comprises a layer of piezoelectric material arranged between two metal electrodes, which is exemplarily shown for the series resonator 110, having a piezoelectric layer 116 and the two electrodes 112 and 114. The shunt resonators 150, 160, 170 and 180 and the series resonators 110, 120, 130 and 140 may have different resonance frequencies and/or capacities. The hatching in the piezoelectric layers of the shunt resonators shall indicate that the same have lower resonance frequencies with regard to the respective series resonators.

If an electric field is applied between the two electrodes of an acoustic resonator, e.g. a BAW resonator, the reciprocal or inverse piezoelectric effect will cause the BAW resonator to mechanically expand or contract, the case of expansion or of contraction depending on the polarization or piezo-orientation of the piezoelectric material with regard to the polarization of the electric field. This means that the opposite case applies if the electric field is inversely applied between the two electrodes. In the case of an alternating field, an acoustic wave is generated in the piezo-layer, which will propagate parallel to the electric field. The type of acoustic wave driven, i.e. shear or longitudinal wave, depends on the relative orientation between piezo-orientation on the one hand and electric field direction on the other hand. The piezoelectric orientation, or short piezo-orientation, depends, for example, for crystal resonators on the crystal material or crystal grid type, a crystal orientation and the kind of acoustic wave propagation used, i.e. longitudinal and/or shear wave. The piezo-orientation in, e.g., AlN or ZnO can be defined through an orientation of the crystal, e.g., the c-axis or the a-axis. AlN or ZnO crystal resonators may be produced such that the c-axis of the crystal is perpendicular to the plane of layer extension so that longitudinal acoustic waves are generated. In the latter case, for example, the piezoelectric orientation is parallel to the electric field. In general, piezo-orientation may be interpreted as a special crystal orientation of the piezo material used, allowing the isolated generation of a special type of acoustic wave, such as only longitudinal or only transversal depending on the definition of the piezo-orientation, if oriented in parallel to the electric field axis. However, again, the piezo-orientation not necessarily has to be oriented in parallel to the electric field applied. Rather, in an oblique configuration with respect to piezo and electric field orientations, more than the special type of acoustic wave may contribute to the propagated wave thus generated.

The complete layer stack defines the multiple acoustic resonance frequencies. Especially, since the electrodes have a high acoustic impedance only a small reflection occurs at the piezo-electrode interface. The major reflection occurs at the interface of the electrodes with a material having a low acoustic impedance, e.g. air. Therefore, in first order the resonance frequency is defined by the thickness of the piezo layer together with the thickness of the electrodes, wherein whenever this overall thickness equals an integral multiple of half the wavelength $\lambda$ of the acoustic waves, resonance states or in other words acoustic modes or standing waves will occur. The fundamental resonance frequency, or first harmonic frequency $f_1$, will then be in first order inversely proportional to the overall thickness of the piezo-layer and the electrodes. This means that a BAW resonator vibrates at the frequency specified externally by the overall thickness of the piezo-layer and the electrodes. However, the above example is just a simple example for illustration purposes, for the resonant modes always the complete layer stack has to be considered.

In ladder-type filters as shown in FIG. 1 based on BAW resonators a nonlinear behavior has been observed, for example in antenna-duplexers which operate directly at the antenna of mobile phone systems and transmit power levels exceeding certain power values. The dominant facts are the generation of a pronounced second harmonic in the output spectrum of the duplexer and the signal intermodulation of the transmitted signal with signals incoming from the antenna.

Two root causes produce this nonlinearity. The first one is inherent to the device. The piezoelectric factor not only generates the acoustic wave, but also effects two of the main properties of the device: its resonance frequency and its capacitance. This is induced by the variation in electrode separation due to the piezoelectric effect, i.e. if an electric field is applied to a BAW resonator, the reciprocal or inverse piezoelectric effect will cause the BAW resonator to mechanically expand or contract, the case of expansion or of contraction depending on the polarization orientation of the piezoelectric material with respect to the polarization of the applied electric field. A second one is found in the extreme energy density present in the active layers of a BAW device at this power levels: the piezo-effect itself is no longer following a strictly linear relationship between for example mechanical expansion or contraction and the electrical field. Both effects mainly generate a pronounced quadratic term in the system response of each individual BAW resonator and, thus, in the system response of the filter.

Figure 2:
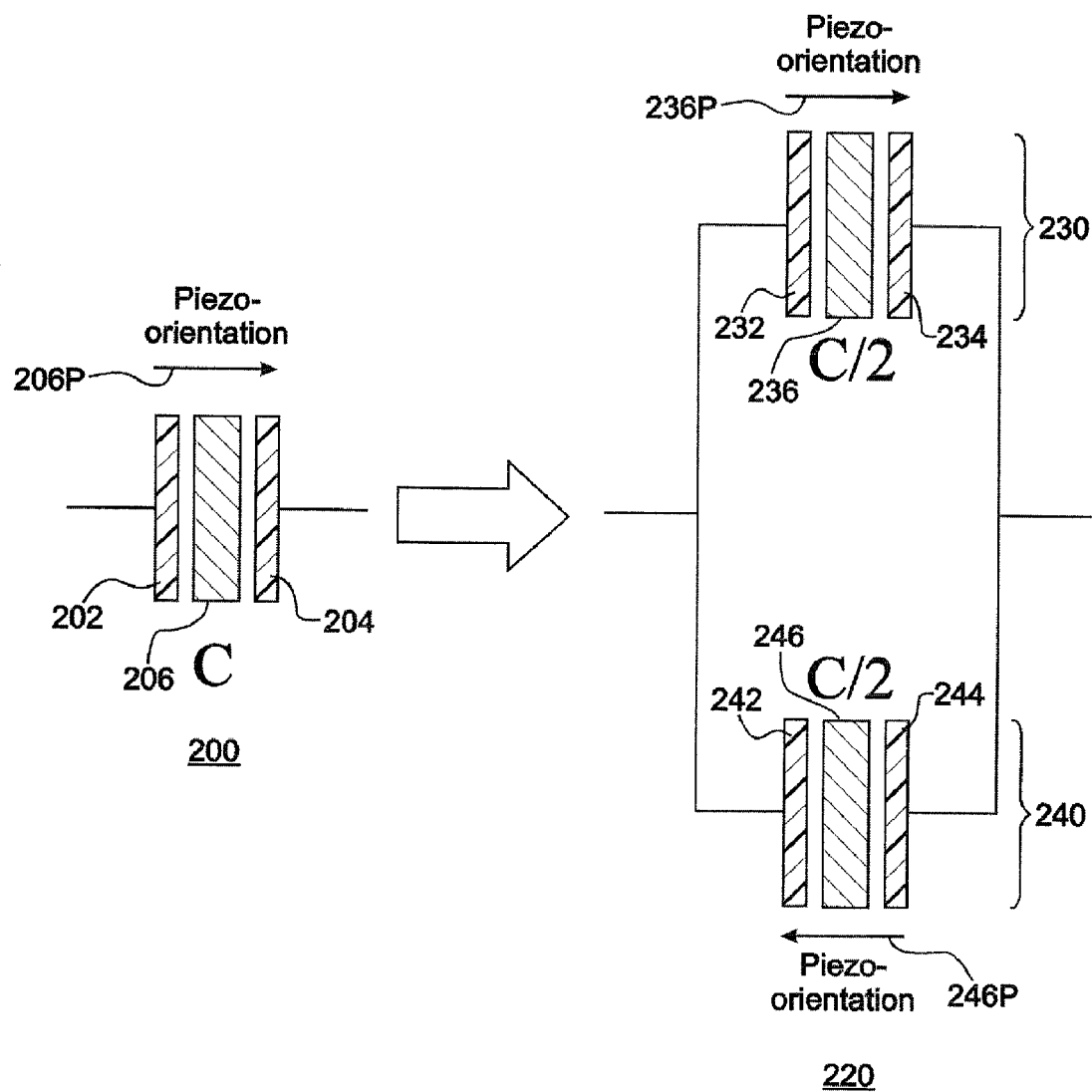
FIG. 2 shows a schematic illustrating a replacement of a nonlinear resonator by two half-sized nonlinear resonators in anti-parallel configuration.

A first possibility to compensate nonlinearity of BAW resonators, is described in the following. According to this method, a BAW resonator with capacity C is split into two identical devices with capacity C/2. These two devices are connected together in anti-parallel configuration with respect to the piezoelectric orientation of the piezoelectric layer. FIG. 2 shows this replacement of a nonlinear resonator 200 by an anti-parallel configuration 220 of two half-sized, i.e. half-capacitance, nonlinear resonators 230, 240 (dimensions of the nonlinear resonators 200, 230 and 240 are not shown in scale). The nonlinear resonator 200 comprises two electrodes 202, 204, a piezoelectric layer 206 with a piezo-orientation 206P and a capacity C. As shown in FIG. 2, the nonlinear resonator 200 is replaced by a pair of anti-parallelly connected nonlinear resonators 230 and 240. The nonlinear resonator 230 has two electrodes 232, 234 and a piezoelectric layer 236 with a piezo-orientation 236P and a capacitance of C/2, i.e. half of the capacitance of the nonlinear resonator 200. The nonlinear resonator 240 has two electrodes 242, 244, a piezoelectric layer 246 with a piezo-orientation 246P. It should be noted that the piezo-orientation 236P of BAW resonator 230 is reverse to the piezo-orientation 246P of the BAW resonator 240.

Since the quadratic nonlinear response is oriented in direction of the piezo-orientation, thus the two quadratic responses of the devices cancel themselves by negative interference. In other words, the piezo-orientation 236P and 246P also indicate the direction of their respective responses, and as their piezo-orientation have reverse directions with respect to a common electrical connection, this configuration is also referred to as anti-parallel configuration. Thereby, the anti-parallel circuit behaves like a single resonator of capacitance C. This method needs less silicon space than another method that is suitable for addressing the non-linearity problems in BAW devices due to the occurrence of high energy densities, the latter method being discussed in the following.

Figure 3:
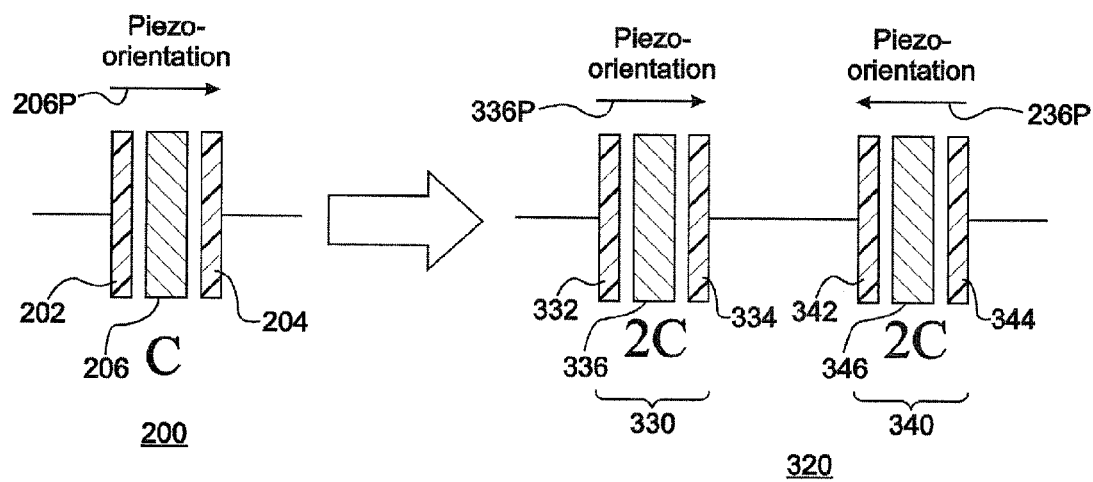
FIG. 3 shows a schematic illustrating a replacement of a nonlinear resonator by two double-sized nonlinear resonators in anti-series configuration.

This other method is referred to as "cascading" of resonators. One resonator with a static capacity of C will be replaced by a chain or series connection of two resonators each having a capacity of 2C; the total capacity thus resulting in C. FIG. 3 shows such replacement of a non-linear resonator 200 by two double-sized nonlinear resonators connected in anti-series configuration with respect to the piezoelectric orientation of the piezoelectric layers. The anti-series configuration 320 comprises two nonlinear resonators 330 and 340 connected electrically in series. The nonlinear resonator 330 has two electrodes 332, 334 and a piezoelectric layer 336 with a piezo-orientation 336P. The nonlinear resonator 340 has two electrodes 342, 344 and a piezoelectric layer 346 with a piezo-orientation 346P. As depicted in FIG. 3, the piezo-orientations 336P and 346P have a reverse orientation with respect to their electrical connection, therefore, this configuration is also referred to as anti-series configuration.

Basically, such a cascaded resonator 320 has the same impedance characteristics as a single resonator 200. The main motivation is to lower the thermal load of resonators by a factor of 4 which is because such a cascaded pair is a factor 4 larger than a single resonator. As a side effect of cascading the energy density in a single device is also a factor 4 lower and the voltage across the electrodes is also a factor 2 lower, resulting in a reduced nonlinear response. In addition, if the two devices 330, 340 are arranged such that for one device 330 the voltage and the piezoelectric orientation are orientated in the same direction while in the other device 340 they are orientated reversely, the nonlinear quadratic responses cancel themselves.

Both methods are based on using two BAW devices. This doubles the electrical and acoustical parasites of the devices and requires additional silicon area needed for a realization of two separated BAW resonators.

Additionally, cascading BAW resonators requires four times the active area and thus will increase the size of a BAW filter dramatically. The active area of a resonator is defined by the smaller one of the electrodes of the resonator. Due to economical filter size restrictions, it is consequently only used for the smallest resonators in the direct signal path (series resonators in a ladder filter) because those resonators have the highest risk of overheating. The direct signal path between the input terminal 102 and the output terminal 104 through the series resonators 110, 120, 130 and 140 is also referred to as the series path or series signal path. In addition, the series circuit of the cascaded resonator will have larger series resistance than its corresponding single device, causing a higher insertion loss in a filter.

The anti-parallel configuration 220, as shown in FIG. 2, suffers from the individual resonators 230 and 240 being smaller. The ratio of the active area to the devices' circumference is consequently lower, causing a reduced device performance. Since the parasitic effects at the resonators' circumference, i.e. the fringing field, are getting more dominant, the quality factor Q and the coupling coefficient k decrease in a smaller resonator. In a filter, this corresponds to a decrease in bandwidth and an increase in insertion loss.

A possible structure for small-band filters is a stacked crystal filter (SCF). This three-terminal device consists of two stacked piezoelectric layers in between three electrodes. FIG. 4A shows an exemplary schematic cross-section of a stacked crystal filter comprising a first electrode 410, a second electrode 420, a intermediate electrode 430, a first piezoelectric body 440 and a second piezoelectric body 450, wherein the intermediate electrode 430 is arranged between the two, first and second, piezoelectric bodies 440 and 450, and wherein the first piezoelectric body 440 is arranged between the first electrode 410 and intermediate electrode 430, and wherein the second piezoelectric body 450 is arranged between the second electrode 420 and the intermediate electrode 430. The piezoelectric bodies 440 and 450 may comprise a single piezoelectric layer or a stack of multiple piezoelectric layers, also referred to as a "sandwich" of materials, and the electrodes 410, 420 and 430 may comprise a single layer or may be a "sandwich" of materials, i.e. a stack of multiple layers. The stacked crystal filter comprises an acoustical mirror 460 in case of a solidly mounted resonator configuration, where the stacked crystal filter is solidly mounted, for example, on a substrate. The stacked crystal filter may also optionally comprise passivation layer 470.

FIG. 4B shows a symbol of a stacked crystal filter (SCF) with the first electrode 410, the second electrode 420, the intermediate electrode 430 and the first and second piezoelectric bodies 440 and 450. As can be clearly seen from FIG. 4B, the stacked crystal filter is a three-terminal device.

Thereby, a possible stacked crystal filter device may be used in a configuration where the intermediate electrode 430 is connected to one terminal of the input and one terminal of the output of the filter, and one outer electrode 410 is connected to the other input terminal of the filter, while the other outer electrode 420 is connected to the output of the filter. In possible configurations one connects the intermediate electrode of the stacked crystal filter to ground.

Figure 5A:
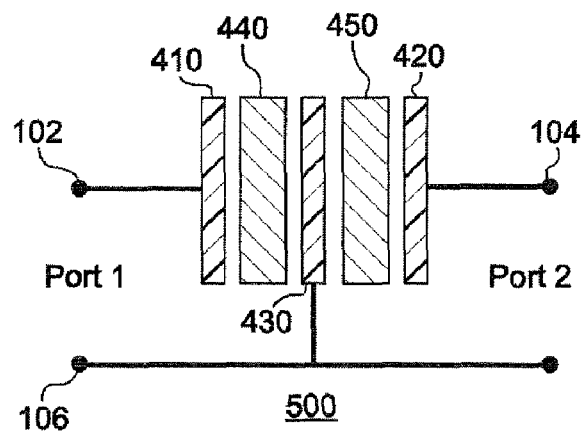
FIG. 5A shows a block diagram of a one-stage SCF-filter.

FIG. 5A shows a one-stage SCF filter 500, wherein the first electrode 410 is connected to the input terminal 102, wherein the second electrode 420 is connected to the output terminal 104, wherein the intermediate electrode 430 is connected to the common terminal 106, and wherein input terminal 102 and common terminal 106 form an input port 1, and wherein the output terminal 104 and the common terminal 106 form an output port 2.

Figure 5B:
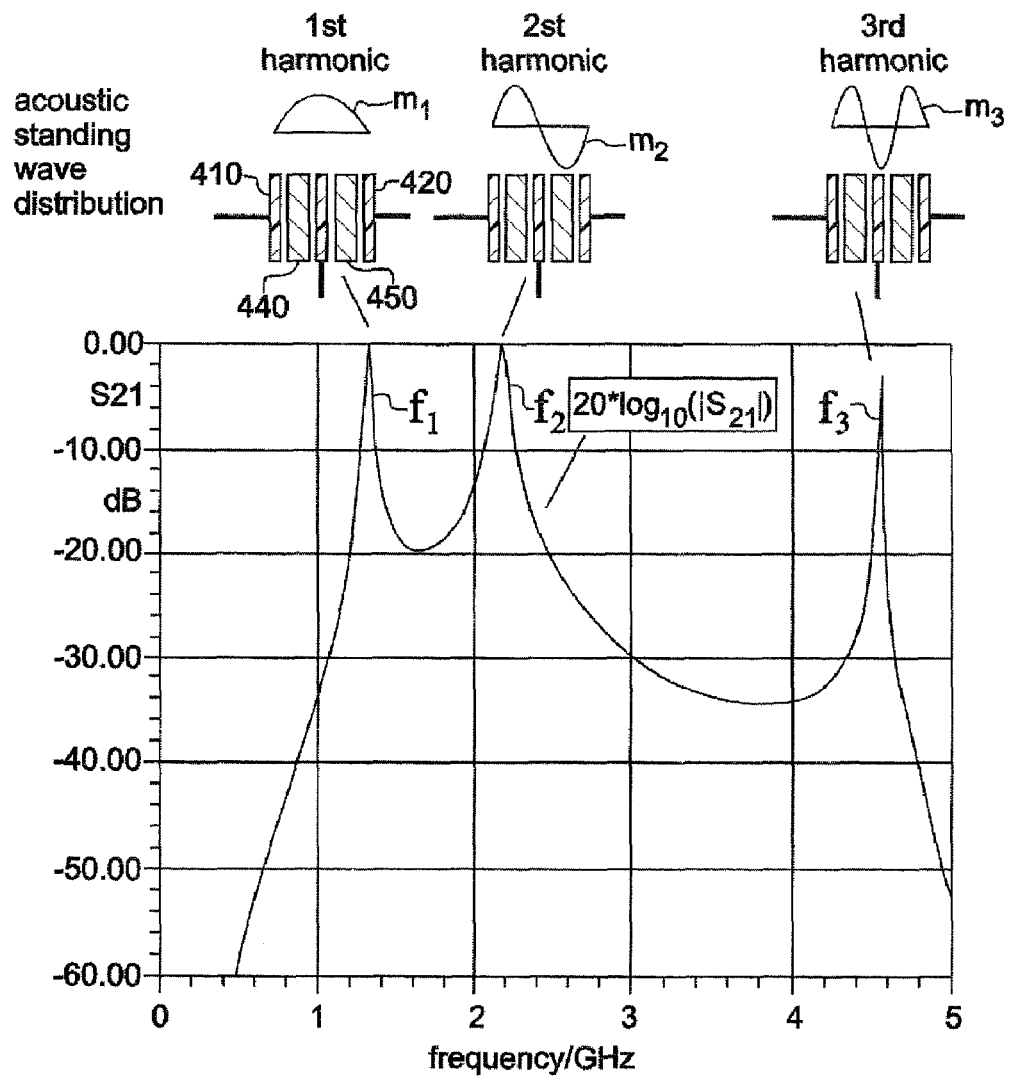
FIG. 5B shows an exemplary transmission curve of a one-stage SCF-filter of FIG. 5A.

FIG. 5B shows an exemplary transmission curve for the one-stage SCF filter 500 shown in FIG. 5A. FIG. 5B plots the attenuation in dB (transmission curve of the forward transfer function S21) over frequency in GHz. At the frequencies $f_1$, $f_2$ and $f_3$ of the acoustic resonances, a signal transmission is observed. The fundamental acoustic resonance at $f_1$ and its higher harmonics $f_2$ and $f_3$ are excited in this configuration. On top of the transmission curve diagram, the acoustic modes $m_1$ (first harmonic or first acoustic mode of the acoustic standing wave distribution), $m_2$ (second harmonic or second acoustic mode of the acoustic standing wave distribution) and $m_3$ (third harmonic or third acoustic mode of the acoustic standing wave distribution) corresponding to the resonance frequencies $f_1$, $f_2$ and $f_3$, respectively, are shown. It should be noted that the "acoustic" harmonics or modes should not be confused with the aforementioned pronounced "second harmonic" in the output spectrum, which is a non-linear "harmonic". As can be seen from FIG. 5B, the first acoustic harmonic or mode $m_1$ is defined by the thickness of the whole SCF including the first electrode 410, the second electrode 420, the intermediate electrode 430, the first piezoelectric body 440 and second piezoelectric body 450, see the aforementioned explanation concerning the $\lambda/2$ acoustic resonance criterion of acoustic resonators.

Thus, in the first piezoelectric layer 440, connected to the input port formed by terminals 102 and 106, an acoustic wave is generated, causing an electrical signal at the output port formed by terminals 104 and 106, due to the second piezoelectric layer 450. Since this acoustical coupling between the output and the filter input is only significant in the region of the resonance frequencies $f_1$, $f_2$ and $f_3$ of the device, a filter functionality is observed. Often, SCF filters are cascaded for obtaining steeper filter skirts, wherein cascading, for example, means connecting a second SCF 500 with its input port to the output port of the first SCF or even more than one additional SCF in such a manner.

Figure 6B:
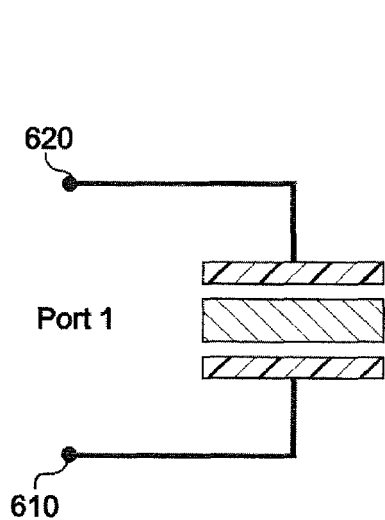
FIG. 6B shows an equivalent two-terminal representation of the stacked crystal resonator of FIG. 6A similar to a possible BAW resonator.
Figure 6A:
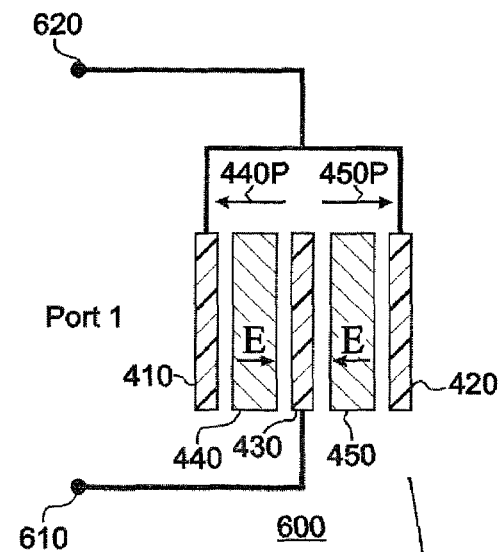
FIG. 6A shows an embodiment of an inventive stacked crystal resonator.
Figure 6B:
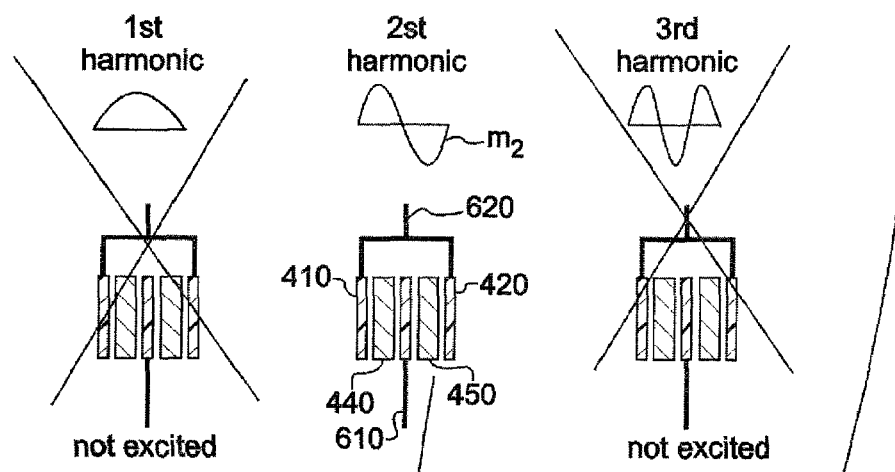
Figure 6B:
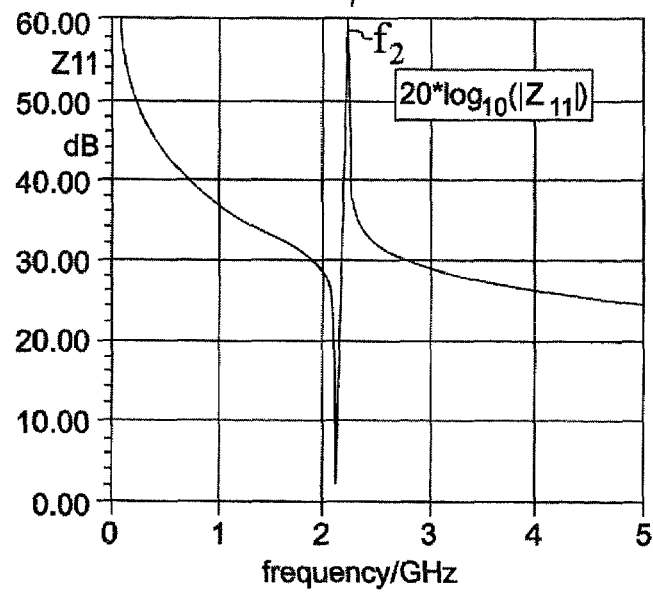

FIG. 6A shows an embodiment of a stacked crystal resonator 600 comprising a stack of a first piezoelectric body 440 and a second piezoelectric body 450.

The stacked crystal resonator 600 comprises further a intermediate electrode 430 being arranged between the first and second piezoelectric bodies 440 and 450 forming a first terminal 610 of the stacked crystal resonator. The stacked crystal resonator 600 comprises further a first electrode 410 and a second electrode 420, wherein the first electrode 410 is arranged such that the first piezoelectric body 440 is arranged between the first electrode 410 and the intermediate electrode 430, wherein the second electrode 420 is arranged such that the second piezoelectric body 450 is arranged between the second electrode 420 and the intermediate electrode 430, and wherein the first and second electrodes 410 and 420 are electrically connected to each other forming a second terminal 620 of the stacked crystal resonator 600. In other words the SCF-R can be regarded as a stack of two resonators, a first and a second resonator, wherein the first resonator is formed by the first electrode 410, the intermediate electrode 430 and the first piezoelectric body 440, and wherein the second resonator is formed by the second electrode 420, the intermediate electrode 430 and the second piezoelectric body 450.

In the following, the description will also refer to an upper electrode and respective upper piezoelectric body or upper resonator and a lower electrode or lower piezoelectric body or respective lower resonator, in particular when talking about configurations where the stacked crystal resonators are mounted flexibly or solidly on substrates, as will be discussed in more detail later based on FIGS. 7 and 8.

The first piezoelectric body 440 has a first spatial piezoelectric orientation 440P and the second piezoelectric body 450 has a second piezoelectric spatial orientation 450P, wherein the first and second piezoelectric bodies 440 and 450 have the same spatial piezoelectric orientation 440P, 450P respectively, which is indicated by the arrows in FIG. 6A. In embodiments of the stacked crystal resonator the piezoelectric orientation may be directed from the first electrode to the second electrode or vice versa.

By connecting the first (upper) electrode 410 and the second (lower) electrode 420 together, the stacked crystal filter SCF is configured here as a two-terminal device, which is called SCF resonator or stacked crystal resonator (SCR), here. Thereby, the piezoelectric orientations in the two piezoelectric layers are orientated in the same spatial direction, unlike the reduced-size resonators described in the published patent EP 1 438 787 A1. In other words, the embodiment of the stacked crystal resonator is based on the finding that when connecting the first and second terminals 410, 420 of a stacked crystal filter, the two stacked first and second resonators are configured in an anti-parallel configuration because of their common spatial piezoelectric orientations 440P and 450P and their reverse electrical connection with respect to their piezoelectric orientations. To be more explicit, in case, as shown in FIG. 6A, an electric field E is applied to the stacked crystal resonator, the piezoelectric orientation 450P of the second resonator would have the same orientation as the electric field E, wherein the first resonator would have a piezoelectric orientation 440P being opposite to the orientation of the electric field E.

An embodiment of the invention described here is the use of a SCF device in a possible ladder filter, by using a new connectivity configuration forming a highly linear piezoelectric resonator, or in other words BAW by replacing resonators with SCF's in a two-terminal configuration, i.e. stacked crystal resonators, and designed for high linearity in ladder-type filters.

This connection configuration 600 and the symmetry of embodiments of the device allows only even acoustic modes of the corresponding SCF to resonate in the device, resulting in an electrical response at the two terminals 610 and 620 similar to a possible BAW resonator as shown in FIG. 6B for illustrative purposes.

FIG. 6C shows the input impedance $Z_{11}$ of such a stacked crystal resonator corresponding to the one of a simple BAW resonator, since the acoustic odd modes as shown on top of the diagram of the absolute input impedance are not excited. In detail, FIG. 6C shows a diagram of the input impedance $Z_{11}$ in dB over the frequency in GHz and a resonance frequency $f_r$. As can be seen from the acoustic harmonics or modes on top of the diagram, only the even modes of the respective SCF, for example the second acoustic harmonic $m_2$, are excited. As explained, due to the suppression of the odd SCF modes, by setting corresponding boundary conditions in the SCR due to the interconnection, the SCF resonator has an impedance response similar to a BAW resonator. However, the resonance frequency is defined by the complete layer stack. Therefore, roughly speaking, the SCF resonator has approximately the same resonance frequency as a BAW resonator with half of the intermediate electrode, an identical piezo layer and one outside electrode of this SCF resonator, and the second acoustic harmonic of the stacked crystal filter resonator corresponds approximately to a first acoustic harmonic of such a BAW resonator.

The benefits of this SCF resonator in contrast to a possible BAW resonator are manifold. A first major benefit is that such a SCF resonator directly incorporates a cancellation of the nonlinear quadratic response (the second, non-linear harmonic) generated in the first (upper) and second (lower) piezoelectric layer. Similar to the anti-parallel configuration mentioned before, the orientation of the voltage in the first piezoelectric layer with respect to the piezoelectric orientation is anti-parallel to the one in the second piezoelectric layer. Thus, all even terms of the nonlinear electrical responses of the upper and lower piezoelectric layers have different sign and consequently interfere negatively in the two terminals of the SCF resonator.

As an example, one can superimpose a DC voltage at the two terminals 610, 620 of the SCF resonator in addition to a radio frequency (RF) signal at the acoustic resonance of the SCF resonator. If the DC signal causes an expansion of the first (upper) piezoelectric layer 440, it will cause a contraction in the second (lower) piezoelectric layer 450. In the first order, the contraction compensates the expansion such that the total acoustical length and therefore the resonance frequencies are maintained.

In an embodiment of the stacked crystal resonator, the first electrode 410 and the second electrode 420 are directly electrically connected. Thus, the same voltage is applied to both piezoelectric layers to support an optimum cancellation of the second electronic harmonic in the output spectrum of the stacked crystal resonator.

Another embodiment of the stacked crystal resonator comprises a intermediate electrode 430 allowing an acoustic coupling between the first and second piezoelectric bodies, and thus furthermore, allowing a superposition of acoustic modes generated by the first and second piezoelectric bodies for an increased excitation. Further, as described before, since the piezolayers or piezoelectric bodies are driven by a reverse electrical field, quadratic non-linear acoustic effects in the two piezolayers substantially cancel each other in the common acoustical path.

In another embodiment of the stacked crystal resonator, the same spatial piezoelectric orientation extends along a direction between the first and second electrode, i.e. perpendicular to the first and second electrode. In further embodiments also the c-axis maybe perpendicular to the first and second electrode.

It should be noted that, in general, the spatial piezoelectric orientation of the first and second piezoelectric bodies should point to the same direction. However this spatial piezoelectric orientation does not necessarily have to be parallel to the electric field. Therefore, although acoustic resonators comprising AlN or ZnO piezoelectric bodies with a c-axis perpendicular to the electrodes have been described, piezoelectric bodies with other c-axis orientations or even piezoelectric bodies with other crystal grid types than a hexagonal grid are also possible.

Another embodiment of the stacked crystal resonator comprises a first and a second resonator, formed by the first electrode, the first piezoelectric body and the intermediate electrode and the second electrode, the second piezoelectric body and the intermediate electrode, respectively, both resonators exhibiting identical impedance values, and in particular identical capacitance values.

In another embodiment, the stacked crystal resonator has a first, a second or a intermediate electrode, which themselves are a stack of materials, and/or has first or second piezoelectric layers and/or first or second piezoelectric bodies, which themselves are a stack of materials.

In another embodiment of the stacked crystal resonator, the first and second electrodes, the intermediate electrode and the first and second piezoelectric bodies are formed symmetrically with respect to the intermediate electrode.

In another embodiment of the stacked crystal resonator, the stacked crystal resonator is a solidly mounted resonator (SMR), which is preferably mounted on an acoustic mirror.

Alternative embodiments of the stacked crystal resonator may comprise electrodes of different size and material, piezoelectric bodies of different piezoelectric materials, thicknesses and/or piezoelectric orientation or size, potentially resulting in a reduced cancellation of the unwanted second harmonic in the output spectrum of the stacked crystal resonator, but having other advantages, like easier production, faster production and/or reduced production costs or meeting other electrical design objectives.

The aforementioned example also illustrates that for perfect compensation the device or stacked crystal resonator has to be designed such that the piezoelectric layers are of equal thickness (compensation for DC non-resonant signals) and integral extension/contraction due to the standing acoustical wave is identical. The latter especially applies when the standing acoustical wave in the stacked crystal resonator is symmetrical with respect to the middle or intermediate electrode. To meet this condition, unbalanced first (upper) and second (lower) electrodes may be required in solidly mounted resonators (SMR).

A second major benefit is that only half of the active area is required. This becomes clear if one interprets the new device as a possible resonator, which is cut in half, folded and stacked on each other. Since the overall thickness of the stacked crystal resonator is roughly determined by the desired acoustic resonance, the active area is then defined by the required nominal capacitance C. In this new device, the total capacitance C is composed of half the capacitance C/2 between the first (upper) electrode and the center or middle electrode and another half between the middle or intermediate electrode and the second (lower) electrode. Obviously, the active area of the device is thus half the one of a BAW resonator. This is an important advantage as the thickness of crystal or bulk acoustic wave resonators lies within a range of micrometers. In addition, for the case of a solidly mounted resonator, there the resonator sits on a substrate and the lower, for example second electrode, has a capacitive substrate parasite, this parasite also being reduced since the upper, for example first, resonator does not show such a parasite.

Figure 7B:
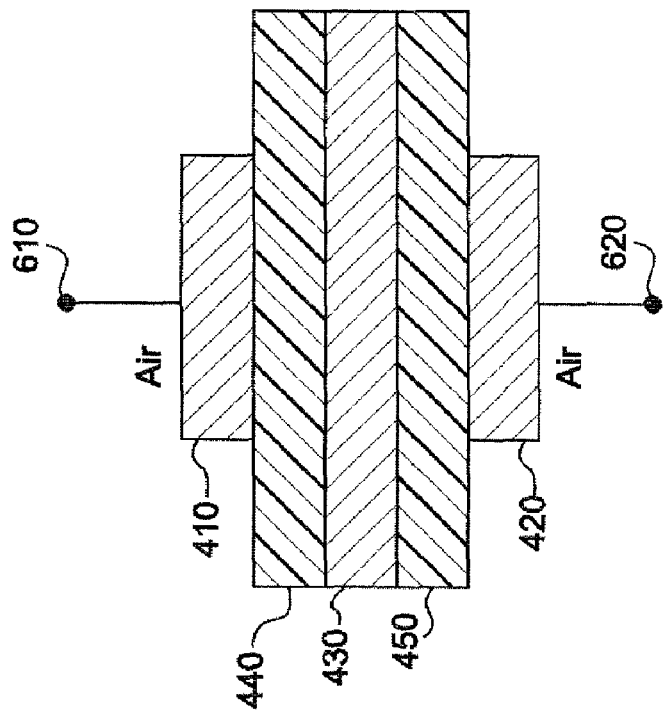
FIG. 7B shows an embodiment of an inventive SCF resonator with an enlarged intermediate electrode.
Figure 7A:
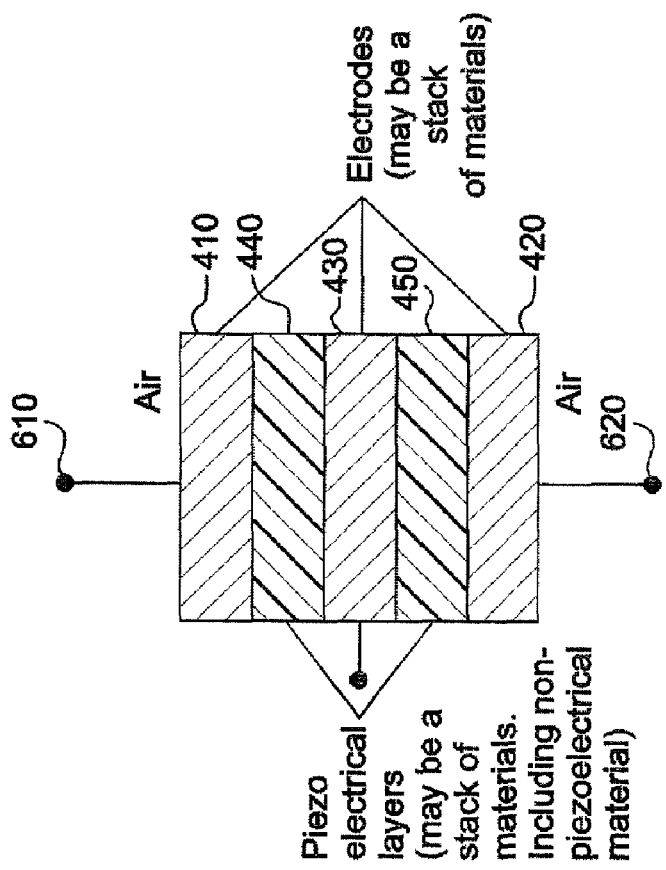
FIG. 7A shows an embodiment of an inventive SCF resonator with equal-sized electrodes.

A first embodiment of a SCF resonator consists of a layer stack as shown in FIGS. 7A and 7B. The structure is a sandwich of three electrodes 410, 420 and 430 and two piezo-layer or -bodies 440 and 450, terminated by air, i.e. mounted flexibly. The material of the three electrodes 410, 420 and 430 has an high acoustic impedance, i.e. tungsten. The piezoelectric layers or bodies 440, 450 have a piezoelectric orientation which is identical and in parallel to the z-axis as shown in FIGS. 7A and 7B. The thicknesses of the outer electrodes are identical as well as the thicknesses of the piezo-layers to maintain the symmetry condition of the acoustical standing wave in the piezo-layers for obtaining perfect cancellation of the nonlinear even terms of the acoustical response. The center or middle electrode 430, the first electrode 410 or the second electrode 420 may vary in thickness to tune the acoustical main resonance to the desired frequency, i.e. varying this thickness, series and shunt resonators of a ladder-type filter can be obtained, wherein, for example, the resonance frequency of the shunt resonators differ from the resonance frequency of the series resonators by more than 2%. In preferred embodiments, the thickness of the intermediate electrode is varied. Both electrodes as well as the piezoelectric layers may consist of sandwiches of different material layers to improve the overall resonator performance, i.e. reduction of electrical resistance, as described in the "sandwich" patent, in the following referred to as [4], and temperature compensation as described by K. M. Lakin, "Thin film resonator technology", IEEE 2003 FCS-EFTF Paper We1A-4, page 6, in the following referred to as [5].

In such a case, the sandwiches again are arranged symmetrically with respect to the inner electrode such that the mentioned symmetry requirement is satisfied. The areas of the electrodes are chosen such to obtain a desired DC capacitance of the resonator. Thereby, the inner electrode not necessarily has the same electrode area as the outer electrodes, to for example simplify processing. The SCF resonator with enlarged intermediate electrode is shown in FIG. 7B, wherein the SCF resonator with equal-sized electrodes 410, 420, 430 is shown in FIG. 7A.

The electrodes 410, 420 and 430 may be a sandwich of materials. The piezoelectric bodies 440 and 450 may be a sandwich of materials, including non-piezoelectric materials.

Figure 8:
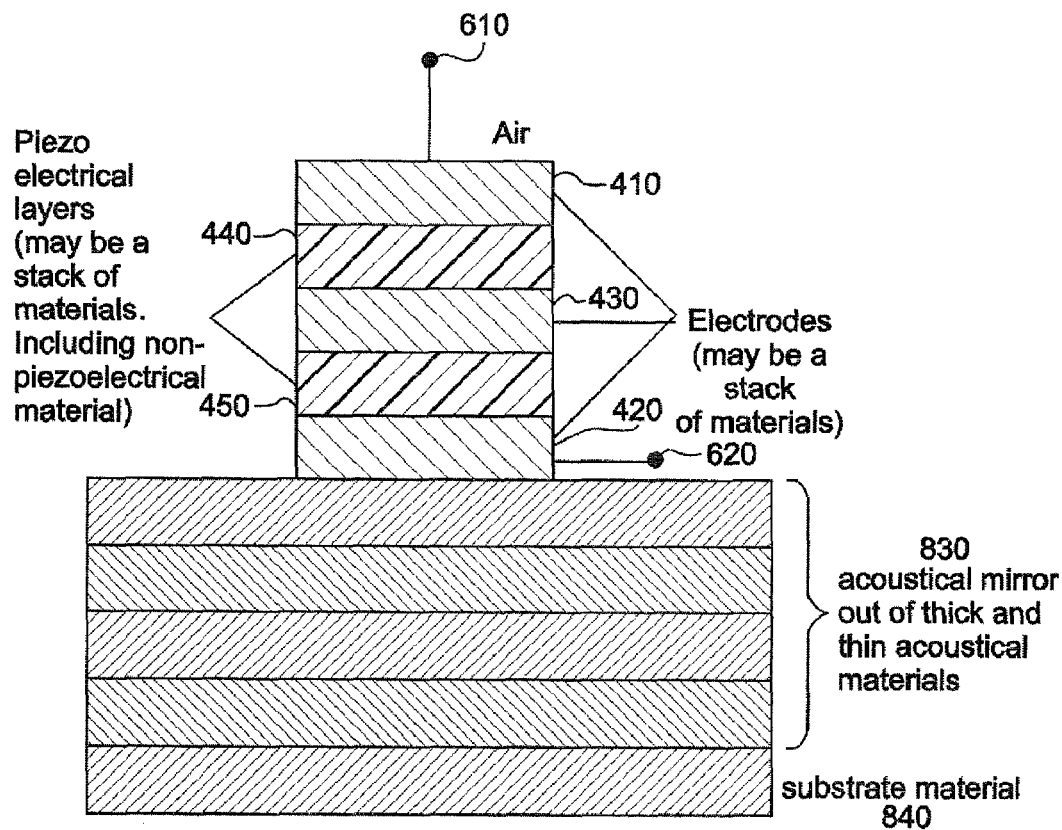
FIG. 8 shows an embodiment of an inventive SCF resonator as solidly mounted resonator (SMR) with equal-sized electrodes above an acoustic mirror.

A second embodiment of the SCF resonator is shown in FIG. 8. In contrast to the first embodiment, the SCF resonator here sits on, for example, an acoustic mirror as described in U.S. Pat. No. 6,933,807 above a substrate. The mirror reflects the acoustical wave such that again a standing acoustical wave at the resonance frequency is observed. Again the upper electrode 410 is terminated by air. This inherent asymmetry in the termination introduces an asymmetry to the acoustical standing wave. Therefore, to satisfy the symmetry condition for the acoustical standing wave, the lower electrode's 420 thickness is adjusted and is not identical to the thickness of the upper electrode 410. The same objective could be achieved by following further measures or a combination of them: non-identical electrodes, non-identical piezo-layers, non-quarter wavelength mirrors. In general it can be said that the layer stack should be designed such that besides meeting the symmetry requirements it also has electrodes which are sufficiently thick and which, if necessary, comprise multiple materials to guarantee a good electrical conductivity, and which is also designed such that the electro-acoustic coupling achieves a given value or is maximized.

The acoustic mirror is a stack of alternating high and low acoustic impedance materials above a substrate material. The SCF resonator shown in FIG. 8 is also referred to as solidly mounted resonator, wherein the SCF resonator as shown in FIG. 8 has equal sized materials. Other embodiments of solidly mounted resonators may comprise different sized electrodes.

Figures 9A, 9B:
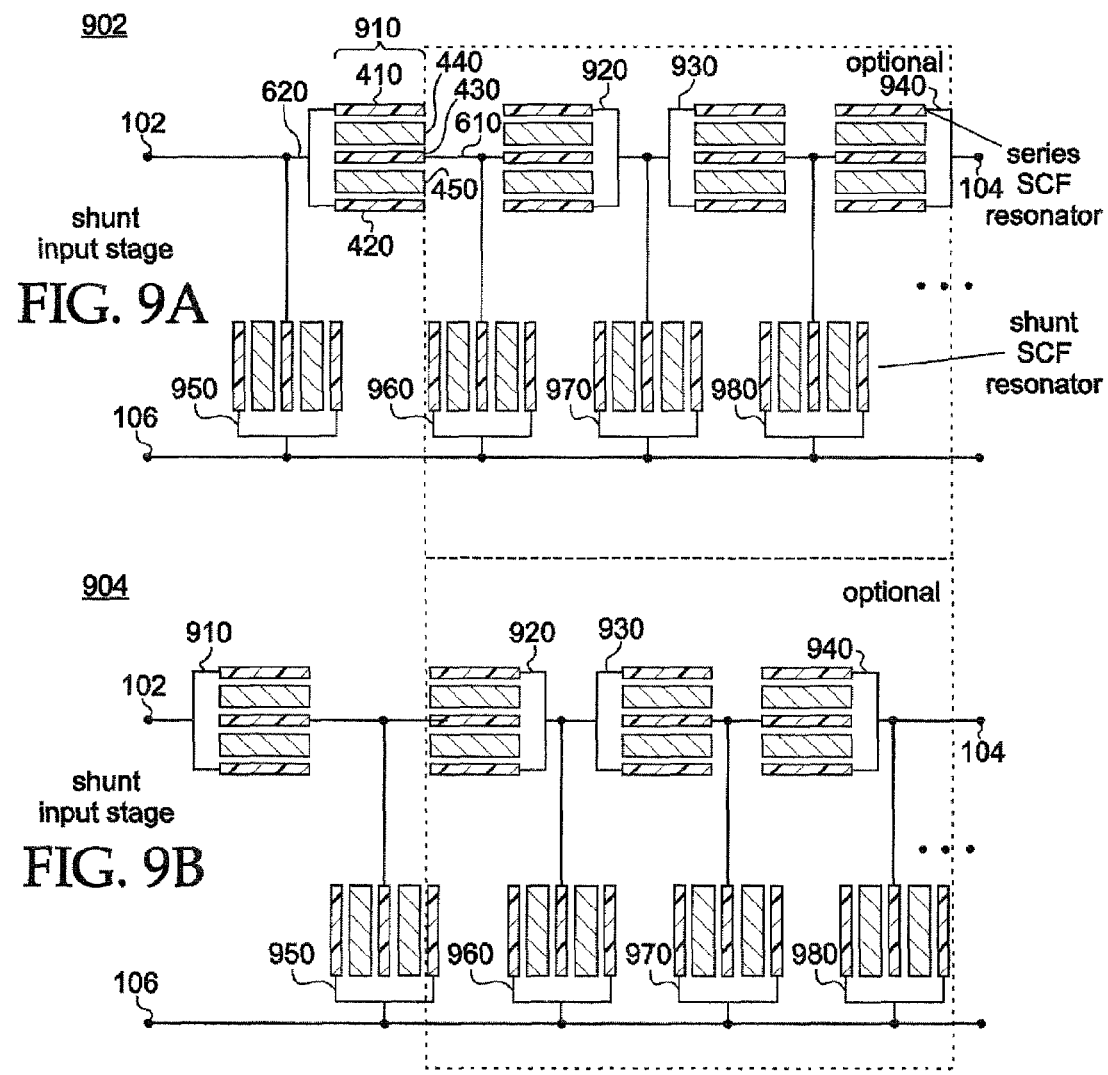
FIG. 9A shows an embodiment of an inventive ladder-type filter based on SCF resonators with a shunt input stage.
FIG. 9B shows an embodiment of an inventive filter with ladder-type structure based on SCF resonators with a series input stage.

As explained previously, the connection configuration as shown in FIG. 6 resulting in an electrical response at the two terminals similar to a BAW resonator allows that the stacked crystal resonator can directly replace two-terminal resonators in ladder-type filters, without changing the filter response. Thereby, a possible ladder-type filter consists of at least one shunt resonator and one series resonator, as shown in FIGS. 9A and 9B. FIG. 9A shows an embodiment of a ladder-type filter with four series SCF resonators 910, 920, 930, 940 and four shunt SCF resonators 950, 960, 970, 980. All SCF resonators are embodiments of a SCF resonator as shown in FIG. 6A, what is exemplarily depicted in detail for the first SCF resonator 910 by the reference signs. The series SCF resonators 910, 920, 930 and 940 are connected in the series signal path of the embodiment of the ladder-type filter between the input terminal 102 and the output terminal 104. The shunt SCF resonators 950, 960, 970 and 980 are connected between the series signal path and the common terminal 106, wherein each pair of one series resonator and one shunt resonator forms one filter stage. Accordingly, series SCF resonator 910 forms together with the first shunt SCF resonator 950 a first filter stage, second SCF resonator 920 forms a second filter stage together with second shunt SCF resonator 960, third SCF resonator 930 forms together with third shunt SCF resonator 970 a third filter stage and fourth series SCF resonator 940 forms together with fourth shunt SCF resonator 980 a fourth filter stage. A ladder-type filter comprises at least one filter stage, i.e. at least one series and one shunt resonator. Other embodiments of ladder-type filters based on SCF resonators may comprise two, three, four or even more filter stages or at least one full stage, i.e. a stage comprising a series and a shunt resonator, and one or more half stages, i.e. a series-resonator following a shunt resonator or vice versa, or a mix of half stages and further full stages. These optional filter stages are shown by the dotted lines in FIGS. 9A and 9B. As the first shunt SCF resonator 950 is directly connected to the input terminal 102, the embodiment 902 of the ladder-type filter shown in FIG. 9A is also referred to as shunt input stage ladder-type filter.

Accordingly, the shunt SCF resonators of each stage of embodiment 902 are connected directly to the first terminal 610 of the preceding series SCF resonator, in this case the first terminal 610 forming the output terminal 620 of the series SCF resonators.

FIG. 9B shows a different embodiment 904 of a ladder-type filter based on SCF resonators. Here, the shunt SCF resonator of each stage is connected to the first terminal 610 of the series SCF resonator of the same stage, here the first terminal 610 forming the output terminal of the series SCF resonators. Therefore, the embodiment 904 is also referred to as series input stage ladder-type filter. As for the embodiment shown in FIG. 9A, a series input stage ladder-type filter may comprise one stage or any higher number of stages.

As discussed before, a possible ladder-type filter consists of at least one shunt resonator and one series resonator. The shunt resonator thereby typically has a lower resonance frequency than the series resonator. Additional series and shunt resonators, i.e. additional stages, can be cascaded to this first stage, wherein these additional resonators have a frequency identical to or near a resonance frequency of the first resonator of the same type.

An embodiment of the invention described here is the use of a SCF device in a possible ladder filter, by using a new connectivity configuration forming a highly linear piezoelectric resonator.

Figure 10A:
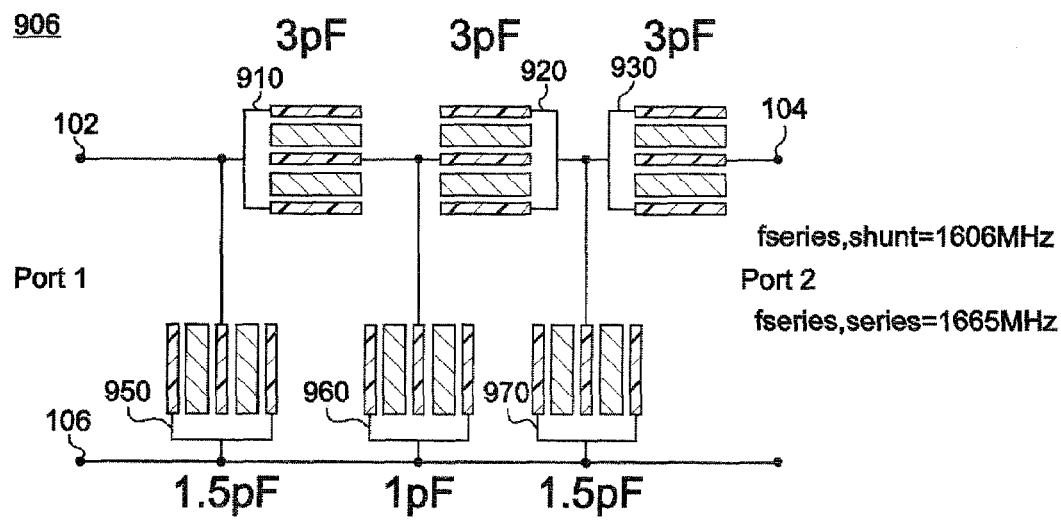
FIG. 10A shows an exemplary block diagram of an inventive filter with ladder-type structure.

FIG. 10A shows an embodiment of a three series/three shunt-filter consisting of SCF resonators, or in other words a ladder-type filter with three SCF series and three SCF shunt resonators. The shunt resonators 950, 960 and 970 have a slightly lower frequency than the series resonators 910, 920 and 930. This can be for example achieved by thickening the intermediate electrode of the shunt resonators with respect to the electrode thickness of the series resonators. In FIG. 10A such a configuration is exemplarily shown: the resonance frequency of the series resonators is $f_{series}$=1665 MHz, whereas the resonance frequency $f_{shunt}$=1606 MHz is slightly lower, in fact more than 2% lower than the resonance frequency of the series resonance. The areas of the individual resonators in the series path 910, 920 and 930 are for simplicity reasons of equal size, and the areas of the individual shunt resonators 950, 960 and 970 are also for simplicity reasons of equal size but having only half the size of the areas of the series SCF resonators. Accordingly, the exemplary series SCF resonators 910, 920, 930 have a capacitance value of C=3 pF and the exemplary shunt SCF resonators 950, 960, 970 have only half the capacitance, i.e. C/2=1.5 pF. In typical embodiments of the filter structure, the areas of the individual resonators will not be equal but will differ from each other to meet the filter passband, stopband and matching requirements.

Figure 10B:
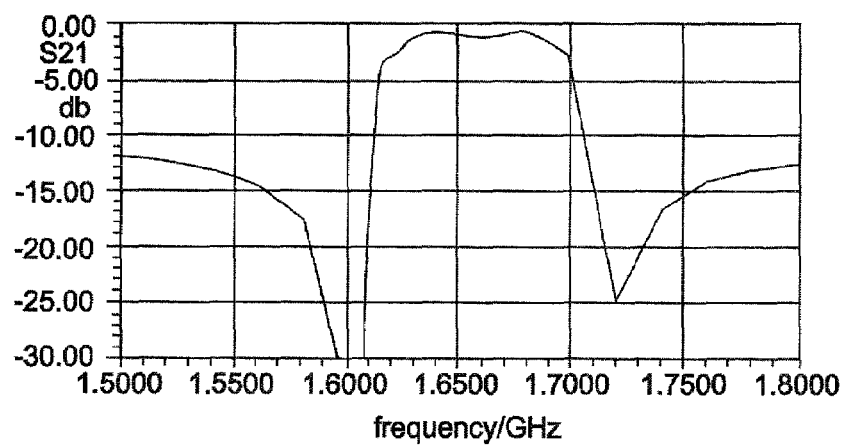
FIG. 10B shows an exemplary transmission curve for the filter according to FIG. 10A.

The interconnection between the resonators can basically be freely chosen, but for minimizing substrate parasites in case of solidly mounted resonator-type resonators, the outer electrodes of the shunt resonator are connected to ground, i.e. in FIG. 10A to the common terminal 106. FIG. 10B shows an exemplary diagram of an embodiment of a filter according to FIG. 10A. The diagram shows a forward transfer function S21 (attenuation) in dB over the frequency in GHz.

Despite the fact that FIGS. 9 and 10 showed embodiments of a ladder-type filter structure only using embodiments of the SCF resonators, other embodiments of the ladder-type filter structures may only use one SCF resonator, for example either as a series resonator or as a shunt resonator in at least one stage of the embodiment of a ladder-type filter structure, wherein the other resonators may be for example traditional BAW resonators.

Figure 11:
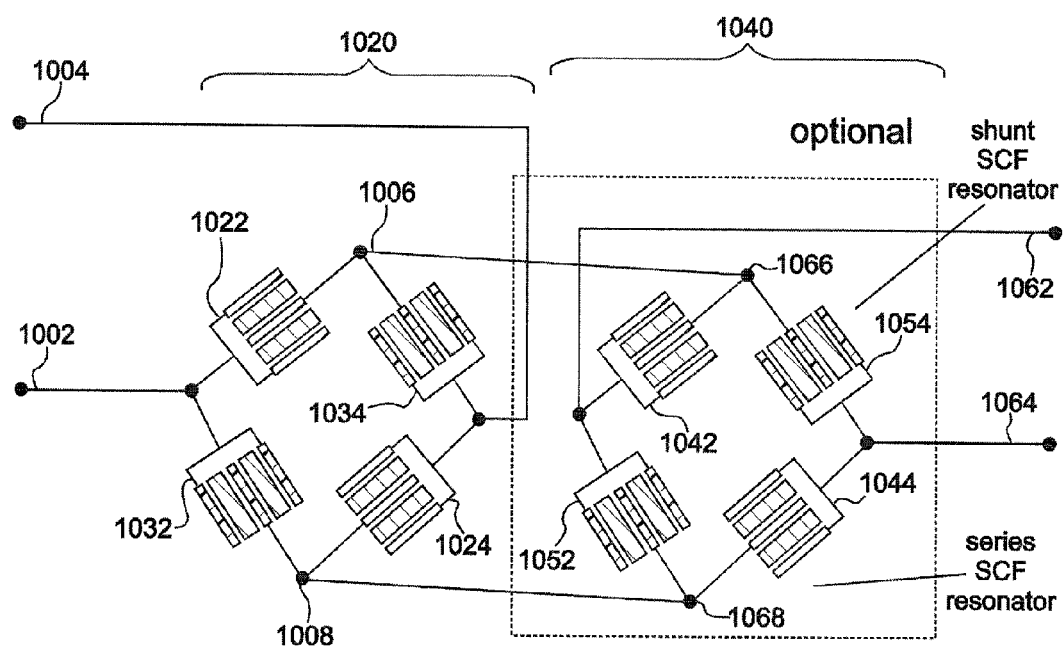
FIG. 11 shows an exemplary block diagram of an inventive filter with a lattice-structure based on SCF resonators.

FIG. 11 shows an embodiment of a lattice-type filter structure, in which SCF resonators as described above may be used. FIG. 11 shows a lattice-type filter structure with two lattice stages 1020 and 1040. The lattice stage 1020 comprises first and second series acoustic resonators 1022, 1024 and first and second shunt acoustic resonators 1032, 1034, wherein a second terminal of the first series acoustic resonator 1022 is connected to a second terminal of the first shunt acoustic resonator 1032 forming a first input terminal 1002 of the filter structure, wherein a second terminal of the second series acoustic resonator 1024 is connected to a second terminal of the second shunt acoustic resonator 1034 forming a second input terminal 1004 of the filter structure. Furthermore, a first terminal of the first series acoustic resonator 1022 is connected to a first terminal of the second shunt acoustic resonator 1034 forming a first output terminal 1006 of the lattice stage 1020, and a first terminal of the first shunt acoustic resonator 1032 is connected to a first terminal of the second series acoustic resonator 1024 forming a second output terminal 1008 of the lattice stage 1020. The lattice stage 1040 comprises first and second series acoustic resonators 1042, 1044 and first and second shunt acoustic resonators 1052, 1054, wherein a second terminal of the first series acoustic resonator 1042 is connected to a second terminal of the first shunt acoustic resonator 1052 forming a first output terminal 1062 of the filter structure, wherein a second terminal of the second series acoustic resonator 1044 is connected to a second terminal of the second shunt acoustic resonator 1054 forming a second output terminal 1064 of the filter structure. Furthermore, a first terminal of the first series acoustic resonator 1042 is connected to a first terminal of the second shunt acoustic resonator 1054 forming a first input terminal 1066 of the lattice stage 1040, which is connected to the first output terminal 1006 of the lattice stage 1020, and a first terminal of the first shunt acoustic resonator 1052 is connected to a first terminal of the second series acoustic resonator 1054 forming a second input terminal 1068 of the lattice stage 1020, which is connected to the second output terminal 1008 of the lattice stage 1020. The lattice structure 1040 is optional, on the other hand more than two lattice structures may be provided and concatenated as shown in FIG. 11 for the lattice structures 1020 and 1040. The interconnection between lattice structures and/or to external devices is arbitrary.

In the above embodiment of a lattice-type filter structure at least one or all of the acoustic resonators may be formed as a SCF resonator in accordance with one of the embodiments described above.

Further alternative embodiments of filter structures may comprise any combination of ladder-type and lattice-type structures, for example a lattice-filter stage with a shunt ladder half stage.

It should be noted that an additional advantage of embodiments of the SCF resonators is that they can be easily produced because, for example, for changing a production line from producing a SCF to producing a SCF resonator only the step of connecting the first and the second electrode of the SCF electrically to form the second terminal of the SCF resonator needs to be taken into consideration.

Similarly, a method for producing a ladder structure filter or a lattice structure filter with stacked crystal resonators comprises basically the steps of providing at least one stacked crystal filter, connecting the first and the second electrode of the stacked crystal resonator electrically to form the second terminal of the stacked crystal resonator and connecting the stacked crystal resonator so that the stacked crystal resonator is connected in a series or shunt path of the ladder structure. For producing ladder structures comprising more than one stacked crystal resonator, a further step of the method is to connect the second stacked crystal resonator in, for example, a shunt path in case that first stacked crystal resonator was placed in the series path and vice versa.

While this invention has been described in terms of several preferred embodiments, there are alterations, permutations and equivalents that fall within the scope of this invention. It should also be noted that there are many alternative ways of implementing the methods and compositions of the present invention. It is therefore intended that the following appended claims be interpreted as including such alterations, permutations and equivalents as falling within the true spirit and scope of the present invention.

The invention claimed is:

1. An acoustic resonator, comprising:
   a stack of a first and a second piezoelectric body, wherein said first and second piezoelectric bodies have substantially the same spatial piezoelectric orientation;
   an intermediate electrode being arranged between said first and said second piezoelectric body forming a first terminal of said acoustic resonator; and
   first and second electrodes, wherein said first electrode is arranged such that said first piezoelectric body is arranged between said first electrode and said intermediate electrode, wherein said second electrode is arranged such that said second piezoelectric body is arranged between said second electrode and said intermediate electrode, and wherein said first and said second electrode are electrically connected to each other forming a second terminal of said acoustic resonator.

2. An acoustic resonator according to claim 1, wherein said intermediate electrode is configured to allow an acoustic coupling between said first and said second piezoeleciric body.

3. An acoustic resonator according to claim 1, wherein said spatial piezoelectric orientation extends along a direction between said first and said second electrode.

4. An acoustic resonator according to claim 1, wherein said first electrode and said second electrode are directly electrically connected.

5. An acoustic resonator according to claim 1, wherein said first electrode, said first piezoelectric body and said intermediate electrode form a first resonator, wherein said second electrode, said second piezoelectric body and said intermediate electrode form a second resonator connected anti-parallel between said first terminal and said second terminal.

6. An acoustic resonator according to claim 5, wherein an impedance of said first resonator and said second resonator exhibit essentially identical values.

7. An acoustic resonator according to claim 1, wherein said first piezoelectric body, said second piezoelectric body, said first electrode, said second electrode or said intermediate electrode has a sandwich structure.

8. An acoustic resonator according to claim 1, wherein said first and said second electrode, said intermediate electrode and said first and said second piezoelectric body of said acoustic resonator are formed symmetrically with respect to said intermediate electrode.

9. An acoustic resonator according to claim 1, wherein said acoustic resonator comprises a solidly mounted resonator (SMR).

10. An acoustic resonator according to claim 9, wherein said acoustic resonator is configured to be mounted on an acoustic mirror.

11. An arrangement including an acoustic resonator, comprising:
the acoustic resonator, having a stack of a first and a second piezoelectric body, wherein said first and second piezoelectric bodies have substantially the same spatial piezoelectric orientation, an intermediate electrode being arranged between said first and said second piezoelectric body forming a first terminal of said acoustic resonator, and first and second electrodes, wherein said first electrode is arranged such that said first piezoelectric body is arranged between said first electrode and said intermediate electrode, wherein said second electrode is arranged such that said second piezoelectric body is arranged between said second electrode and said intermediate electrode, and wherein said first and said second electrode are electrically connected to each other forming a second terminal of said acoustic resonator, said acoustic resonator arranged in a series path of a ladder structure or in a shunt path of said ladder structure.

12. An arrangement according to claim 11, wherein said intermediate electrode allows an acoustic coupling between said first and said second piezoelectric body.

13. An arrangement according to claim 11 wherein said spatial piezoelectric orientation extends along a direction between said first and said second electrode.

14. An arrangement according to claim 11 further comprising: a further acoustic resonator, having a stack of a third and a fourth piezoelectric body, wherein said third and fourth piezoelectric bodies have substantially the same spatial piezoelectric orientation, a second intermediate electrode being arranged between said third and said fourth piezoelectric body forming a first terminal of said further acoustic resonator, and third and fourth intermediate electrodes, wherein said acoustic resonator is arranged in said series path of said ladder structure, and wherein said further acoustic resonator is arranged in said shunt path of said ladder structure.

15. The arrangement according to claim 14, wherein said second intermediate electrode is configured to allow an acoustic coupling between said third and said fourth piezoelectric body.

16. The arrangement according to claim 14, wherein said same spatial piezoelectric orientation extends along a direction between said third and said fourth electrode.

17. A arrangement according to claim 14, wherein said intermediate electrode of the acoustic resonator and said second intermediate electrode of the further acoustic resonator have thicknesses intermediate electrode that differ by an amount such that a resonance frequency of said further acoustic resonator differs by an amount of more than 2% from a resonance frequency of said acoustic resonator.

18. An arrangement according to claim 11, wherein said acoustic resonator is part of a first stage of said ladder structure, and wherein said filter comprises at least one further stage, said further stage comprising another acoustic resonator arranged in a series path or a shunt path of further said stage, wherein said another acoustic resonator has a stack of a fifth and a sixth piezoelectric body, wherein said fifth and sixth piezoelectric bodies have substantially the same spatial piezoelectric orientation, a third intermediate electrode being arranged between said fifth and said sixth piezoelectric body forming a first terminal of said another acoustic resonator, and fifth and sixth electrodes, wherein said fifth electrode is arranged such that said fifth piezoelectric body is arranged between said fifth electrode and said third intermediate electrode, wherein said sixth electrode is arranged such that said sixth piezoelectric body is arranged between said sixth electrode and said third intermediate electrode, and wherein said fifth and said sixth electrode are electrically connected to each other forming a second terminal of said another acoustic resonator.

19. A method, comprising:
providing a structure, comprising a stack of a first and a second piezoelectric body, wherein said first and second piezoelectric bodies have substantially the same spatial piezoelectric orientation, an intermediate electrode being arranged between said first and said second piezoelectric body forming a first terminal of an acoustic resonator, and first and second electrodes, wherein said first electrode is arranged such that said first piezoelectric body is arranged between said first electrode and said intermediate electrode, and wherein said second electrode is arranged such that said second piezoelectric body is arranged between said second electrode and said intermediate electrode;
connecting said first and said second electrode electrically to form a second terminal of said acoustic resonator.

20. A method according to claim 19, further comprising: an intermediate electrode connecting said acoustic resonator so that said acoustic resonator is connected in a series or shunt path of said ladder structure.

21. A method according to claim 20, comprising the further step of:
providing a further structure, comprising a stack of a third and a fourth piezoelectric body, wherein said third and fourth piezoelectric bodies have substantially the same spatial piezoelectric orientation, comprising a second intermediate electrode being arranged between said third and said fourth piezoelectric body forming a first terminal of a further acoustic resonator, and comprising third and fourth intermediate electrodes;
connecting said third and said fourth electrode of said further acoustic resonator electrically to form a second terminal of said further acoustic resonator;
connecting said further acoustic resonator so that said further acoustic resonator is connected in the shunt path and connecting said acoustic resonator in the series path.

* * * * *